(12) United States Patent
Chen et al.

(10) Patent No.: US 11,379,648 B2
(45) Date of Patent: *Jul. 5, 2022

(54) PROCESS WINDOW IDENTIFIER

(71) Applicant: ASML NETHERLANDS B.V., Veldhoven (NL)

(72) Inventors: Frank Gang Chen, Fremont, CA (US); Joseph Werner De Vocht, Elk Grove, CA (US); Yuelin Du, San Jose, CA (US); Wanyu Li, Cupertino, CA (US); Yen-Wen Lu, Saratoga, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 16/993,685

(22) Filed: Aug. 14, 2020

(65) Prior Publication Data

US 2020/0372201 A1 Nov. 26, 2020

Related U.S. Application Data

(63) Continuation of application No. 15/821,051, filed on Nov. 22, 2017, now Pat. No. 10,755,025, which is a
(Continued)

(51) Int. Cl.
*G06F 30/398* (2020.01)
*G03F 7/20* (2006.01)

(52) U.S. Cl.
CPC ............ *G06F 30/398* (2020.01); *G03F 7/705* (2013.01); *G03F 7/70508* (2013.01);
(Continued)

(58) Field of Classification Search
CPC ............ G03F 7/70625; G03F 7/70641; G03F 7/7065; G03F 7/70666; G03F 7/705; G03F 7/70508; G06F 30/398
(Continued)

(56) References Cited

U.S. PATENT DOCUMENTS

| 4,890,239 A | 12/1989 | Ausschnitt et al. |
| 6,602,728 B1 * | 8/2003 | Liebmann ................ G03F 1/36 438/14 |

(Continued)

FOREIGN PATENT DOCUMENTS

| CN | 1506767 | 6/2004 |
| CN | 103645611 | 3/2014 |

(Continued)

OTHER PUBLICATIONS

Chun-Wei Wu et al., "Freeform source optimization for improving litho-performance of warm spots," Proc. of SPIE, vol. 8166, pp. 81663C-1-81663C-8 (2011).

(Continued)

*Primary Examiner* — Stacy Whitmore
(74) *Attorney, Agent, or Firm* — Pillsbury Winthrop Shaw Pittman LLP

(57) ABSTRACT

A method for determining an overlapping process window (OPW) of an area of interest on a portion of a design layout for a device manufacturing process for imaging the portion onto a substrate, the method including: obtaining a plurality of features in the area of interest; obtaining a plurality of values of one or more processing parameters of the device manufacturing process; determining existence of defects, probability of the existence of defects, or both in imaging the plurality of features by the device manufacturing process under each of the plurality of values; and determining the OPW of the area of interest from the existence of defects, the probability of the existence of defects, or both.

20 Claims, 6 Drawing Sheets

Related U.S. Application Data continuation of application No. 14/861,847, filed on Sep. 22, 2015, now Pat. No. 9,842,186.

(60) Provisional application No. 62/053,629, filed on Sep. 22, 2014.

(52) U.S. Cl.
CPC ...... *G03F 7/70625* (2013.01); *G03F 7/70641* (2013.01); *G03F 7/70666* (2013.01)

(58) Field of Classification Search
USPC .............................. 382/144–155; 716/50–52
See application file for complete search history.

(56) References Cited

U.S. PATENT DOCUMENTS

| | | |
|---|---|---|
| 6,847,588 B1 | 1/2005 | Wallace et al. |
| 6,882,745 B2 | 4/2005 | Brankner |
| 7,026,082 B2 | 4/2006 | Eurlings et al. |
| 7,333,192 B2 | 2/2008 | Nakano et al. |
| 7,689,948 B1 | 3/2010 | White et al. |
| 7,747,978 B2 | 6/2010 | Ye et al. |
| 7,835,565 B2 | 11/2010 | Cai et al. |
| 8,146,023 B1 | 3/2012 | Kumar |
| 8,200,468 B2 | 6/2012 | Ye et al. |
| 8,407,630 B1 | 3/2013 | Chan et al. |
| 8,418,088 B2 | 4/2013 | Ye et al. |
| 8,755,045 B2 | 6/2014 | Lin et al. |
| 8,832,610 B2 | 9/2014 | Ye et al. |
| 8,913,120 B2 | 12/2014 | Poortinga et al. |
| 8,918,742 B2 | 12/2014 | Feng et al. |
| 8,938,694 B2 | 1/2015 | Liu et al. |
| 9,355,200 B2 | 5/2016 | Chen et al. |
| 9,507,907 B2 | 11/2016 | Fouquet et al. |
| 9,645,509 B2 | 5/2017 | Cao et al. |
| 9,842,186 B2 * | 12/2017 | Chen ................... G03F 7/70625 |
| 10,755,025 B2 * | 8/2020 | Chen ...................... G03F 7/705 |
| 2001/0019625 A1 | 9/2001 | Kenan et al. |
| 2002/0091985 A1 | 7/2002 | Liebmann et al. |
| 2002/0164065 A1 | 11/2002 | Cai et al. |
| 2003/0018948 A1 | 1/2003 | Chang et al. |
| 2006/0234144 A1 | 10/2006 | Watson et al. |
| 2006/0236294 A1 | 10/2006 | Saidin et al. |
| 2007/0031745 A1 | 2/2007 | Ye et al. |
| 2007/0050749 A1 | 3/2007 | Ye et al. |
| 2007/0052963 A1 | 3/2007 | Orbon et al. |
| 2007/0292017 A1 | 12/2007 | Cai et al. |
| 2008/0072207 A1 | 3/2008 | Verma et al. |
| 2008/0147374 A1 | 6/2008 | Chan et al. |
| 2008/0148194 A1 | 6/2008 | Chan et al. |
| 2008/0148195 A1 | 6/2008 | Chan et al. |
| 2008/0246940 A1 | 10/2008 | Van Schoot et al. |
| 2008/0253644 A1 | 10/2008 | Xu et al. |
| 2008/0256504 A1 | 10/2008 | Oishi et al. |
| 2008/0260235 A1 | 10/2008 | Cai et al. |
| 2009/0157360 A1 | 6/2009 | Ye et al. |
| 2009/0206252 A1 | 8/2009 | Obazaki et al. |
| 2009/0245621 A1 | 10/2009 | Cai et al. |
| 2010/0119960 A1 | 5/2010 | Fonseca et al. |
| 2010/0119961 A1 | 5/2010 | Ye et al. |
| 2010/0141925 A1 | 6/2010 | Cao et al. |
| 2010/0162197 A1 | 6/2010 | Ye et al. |
| 2010/0266937 A1 | 10/2010 | Zibold et al. |
| 2010/0324878 A1 | 12/2010 | Lee et al. |
| 2011/0143271 A1 | 6/2011 | Koshiba et al. |
| 2011/0161895 A1 | 6/2011 | Reid et al. |
| 2012/0021343 A1 | 1/2012 | Ye et al. |
| 2012/0052418 A1 | 3/2012 | Tian et al. |
| 2012/0278768 A1 | 11/2012 | Yang et al. |
| 2012/0308112 A1 | 12/2012 | Hu et al. |
| 2013/0031518 A1 | 1/2013 | Robles et al. |
| 2013/0031522 A1 | 1/2013 | Robles et al. |
| 2013/0135600 A1 | 5/2013 | Middlebrooks et al. |
| 2013/0176558 A1 | 7/2013 | Lin et al. |
| 2013/0219348 A1 | 8/2013 | Ye et al. |
| 2013/0267047 A1 | 10/2013 | Shih et al. |
| 2014/0005998 A1 | 1/2014 | Ye et al. |
| 2014/0065734 A1 | 3/2014 | Bauch |
| 2014/0195993 A1 | 7/2014 | Liu et al. |
| 2014/0282291 A1 | 9/2014 | Inoue et al. |
| 2015/0012243 A1 | 1/2015 | Honda et al. |
| 2015/0185625 A1 | 7/2015 | Chen et al. |
| 2015/0185626 A1 | 7/2015 | Chen et al. |
| 2015/0186582 A1 | 7/2015 | Chen et al. |
| 2015/0227654 A1 | 8/2015 | Hunsche et al. |
| 2015/0356233 A1 | 12/2015 | Fouquet et al. |
| 2016/0085905 A1 | 3/2016 | Chen et al. |
| 2016/0246168 A1 | 8/2016 | Ye et al. |
| 2016/0313651 A1 | 10/2016 | Middlebrooks et al. |
| 2017/0046473 A1 | 2/2017 | Fouquet et al. |
| 2017/0160648 A1 * | 6/2017 | Tel ........................... G03F 7/705 |
| 2018/0074413 A1 | 3/2018 | Hunsche et al. |
| 2018/0224752 A1 | 8/2018 | Tel et al. |
| 2018/0259858 A1 | 9/2018 | Chen et al. |
| 2018/0314149 A1 | 11/2018 | Mulkens |

FOREIGN PATENT DOCUMENTS

| | | |
|---|---|---|
| CN | 103645612 | 3/2014 |
| CN | 103744267 | 4/2014 |
| DE | 10 2005 009 536 | 8/2006 |
| EP | 1 875 307 | 8/2009 |
| JP | 2008-242112 | 10/2008 |
| JP | 2008-268560 | 11/2008 |
| JP | 2009-163110 | 7/2009 |
| JP | 2010-102055 | 5/2010 |
| JP | 4958616 | 6/2012 |
| JP | 5045445 | 10/2012 |
| JP | 2013-175016 | 9/2013 |
| KR | 20100009563 | 1/2010 |
| KR | 20100076960 | 7/2010 |
| KR | 20140104465 | 8/2014 |
| TW | 200422887 | 11/2004 |
| TW | 200636521 | 10/2006 |
| TW | 200830129 | 7/2008 |
| TW | 201143411 | 12/2011 |
| TW | 201224482 | 6/2012 |
| WO | 2015/090774 | 6/2015 |
| WO | 2015/120996 | 8/2015 |
| WO | 2016/091534 | 6/2016 |
| WO | 2016/091536 | 6/2016 |
| WO | 2016/096668 | 6/2016 |
| WO | 2016/128189 | 8/2016 |
| WO | 2016/128190 | 8/2016 |
| WO | 2016/142169 | 9/2016 |

OTHER PUBLICATIONS

Huang, Thomas et al., "Improvement of lithography process by using a FlexRay illuminator for memory applications," Proc of SPIE, vol. 7973, pp. 79731X-1-79731X-11 (2011).

Disclosed Anonymously, "Defect Prediction,"Research Disclosure, Database No. 604033, pp. 1-7 (Aug. 2014).

Hunsche, Stefan et al., "A new paradigm for in-line detection and control of patterning defects", Proc. of SPIE, vol. 9424, pp. 24241B-1-94241B-12 (Mar. 19, 2015).

International Search Report dated Oct. 30, 2015 in corresponding International Patent Application No. PCT/EP2015/069541.

Chinese Office Action dated Feb. 1, 2018 in corresponding Chinese Patent Application No. 201580051126.4.

Korean Office Action issued in corresponding Korean Patent Application No. 10-2017-7010934, dated Oct. 12, 2018.

Korean Notice of Allowance issued in corresponding Korean Patent Application No. 10-2017-7010934, dated Jun. 10, 2019.

* cited by examiner ns is a central step in the manu-
PROCESS WINDOW IDENTIFIER This application is a continuation of U.S. patent application Ser. No. 15/821,051, filed Nov. 22, 2017, now allowed, which is a continuation of U.S. patent application Ser. No. 14/861,847, filed Sep. 22, 2015, now U.S. Pat. No. 9,842,186, each of which is incorporated herein in its entirety by reference, and which claims the benefit of priority of U.S. provisional application No. 62/053,629, filed Sep. 22, 2014.

FIELD

The present description relates to a method of optimizing the performance of semiconductor manufacturing process. The method may be used in connection with a lithographic apparatus.

BACKGROUND

A lithographic apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic apparatus, one target portion at a time. In one type of lithographic apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a computer-implemented method for determining an overlapping process window (OPW) of an area of interest on a portion of a design layout for a device manufacturing process for imaging the portion onto a substrate, the method comprising: obtaining a plurality of features in the area of interest; obtaining a plurality of values of one or more processing parameters of the device manufacturing process; determining existence of defects, probability of the existence of defects, or both in imaging the plurality of features by the device manufacturing process under each of the plurality of values; and determining the OPW of the area of interest from the existence of defects, the probability of the existence of defects, or both.

BRIEF DESCRIPTION OF THE DRAWINGS

Embodiments will now be described, by way of example only, with reference to the accompanying schematic drawings in which corresponding reference symbols indicate corresponding parts, and in which.

DETAILED DESCRIPTION

Figure 1:
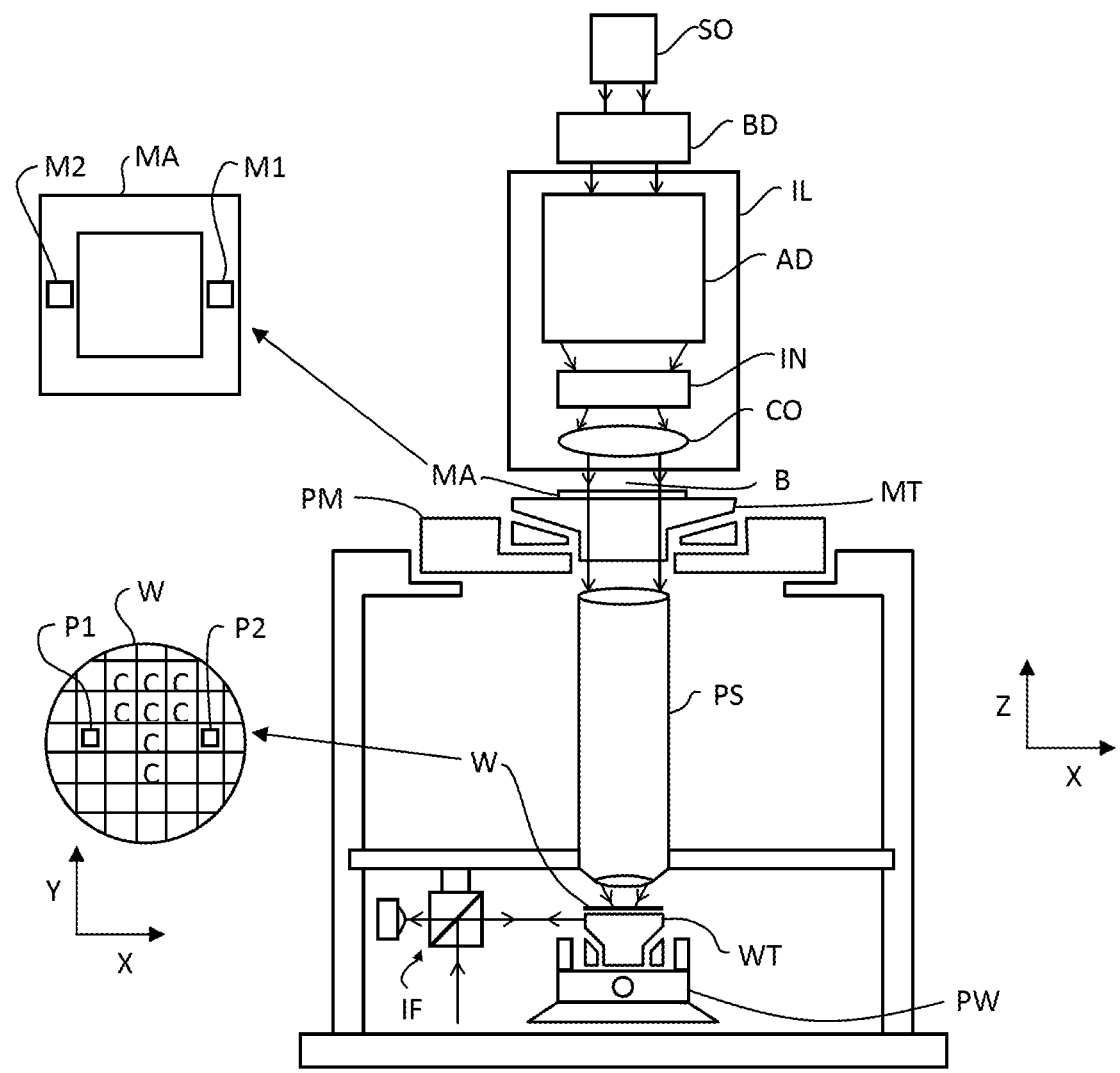
FIG. 1 depicts a lithographic apparatus according to an embodiment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment. The apparatus comprises:

an illumination system (illuminator) IL to condition a beam PB of radiation (e.g. UV radiation or DUV radiation).

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithographic apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithographic apparatus LA. Using a computational lithography technique, the patterning device MA may be designed to at least partially correct for apodizations.

Features on a design layout may have different individual process windows (IPWs). The IPW of a feature is ranges of processing parameters of a device manufacturing process (e.g., lithography, etching) under which the feature will be produced within specifications. Specifications may mean acceptable ranges of characteristics of the feature produced by the device manufacturing process. Examples of specifications include checks for necking, line pull back, line thinning, CD, edge placement, overlapping, resist top loss, resist undercut and bridging. In another word, the IPW is ranges of acceptable values of processing parameters. A value being acceptable here means if the feature is produced under that value, the feature will not become a defect.

Different features may be affected differently by the processing parameters. For example, a feature may be insensitive to the dose because the specification of the feature is very forgiving. The IPW of a feature may be affected by many factors, such as the location and shape of the feature and other features nearby. The overlapping process window (OPW) of a plurality of features (e.g., features in an area of interest) may be obtained by overlapping (e.g., finding a common portion of) the IPWs of the plurality of feature. The boundary of the OPW contains boundaries of the IPWs of some of the features. In another word, these individual features limit the OPW. These features can be referred to as "hot spots" or "process window limiting patterns (PWLPs)," which are used interchangeably herein. When controlling a lithography process, it is possible and economical to focus on the PWLPs. When the PWLPs do not lead to defects, it is most likely that none of the plurality of features leads to defects.

Figure 2:
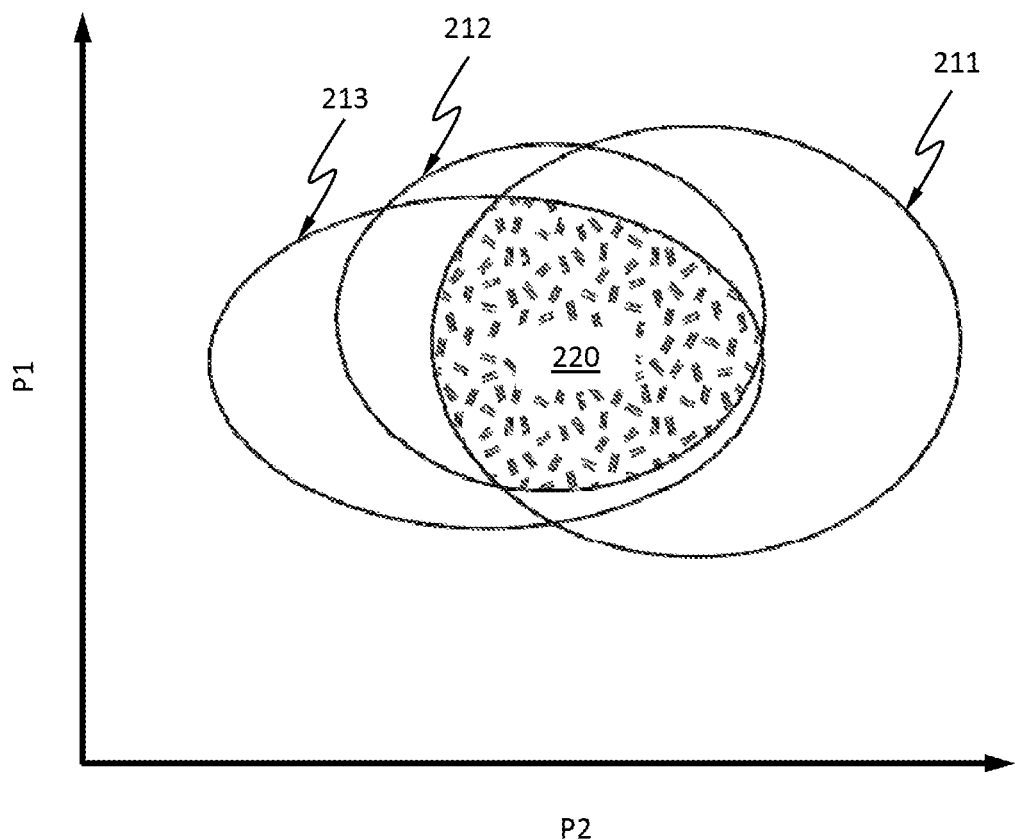
FIG. 2 illustrates the concept of process window limiting patterns (PWLPs)

FIG. 2 illustrates the concept of PWLPs. Assuming a design layout includes three features A, B, and C in an area of interest, which respectively have IPWs 211, 212 and 213. The OPW of the area of interest is the hatched area 220, which is the overlapped area of IPWs 211, 212 and 213. Because the boundary of OPW 220 contains boundaries of IPWs 211, 212 and 213, features A, B, and C are PWLPs. P1 and P2 are two processing parameters. A non-PWLP feature may become a PWLP, and vice versa, due to slight change in the device manufacturing process. When controlling a device manufacturing process such as a lithographic process, it is possible and economical to focus on the PWLPs.

Figure 3:
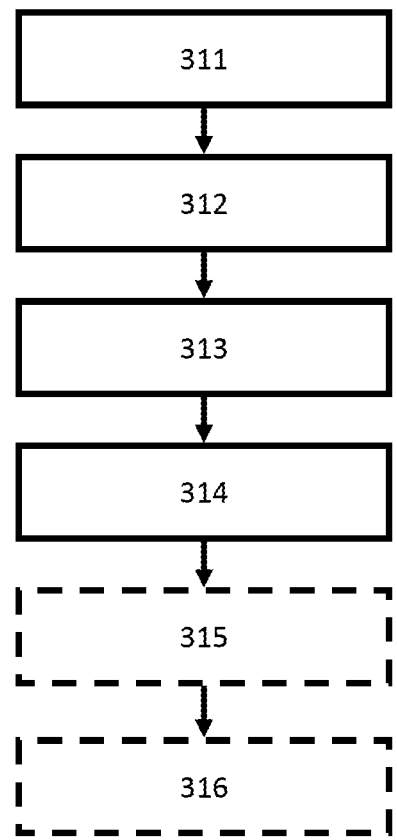
FIG. 3 shows a flow chart for a method of determining the OPW of an area of interest, according to an embodiment.

An area of interest of a design layout may have thousands or even millions of patterns. Identifying the OPW for the area of interest may be computationally very expensive. FIG. 3 shows a flow chart for a method of determining the OPW of an area of interest, according to an embodiment. In step 311, features (e.g., PWLPs) in the area of interest are obtained using any suitable method. For example, the features may be selected based on data representing the design layout. The area of interest may include one or more PWLPs. The area of interest may include two or more disconnected portions of the design layout. The area of interest may be capable of being imaged concurrently onto the substrate by the device manufacturing process. For example, the features may be provided by an operator of the device manufacturing process.

Figure 4:
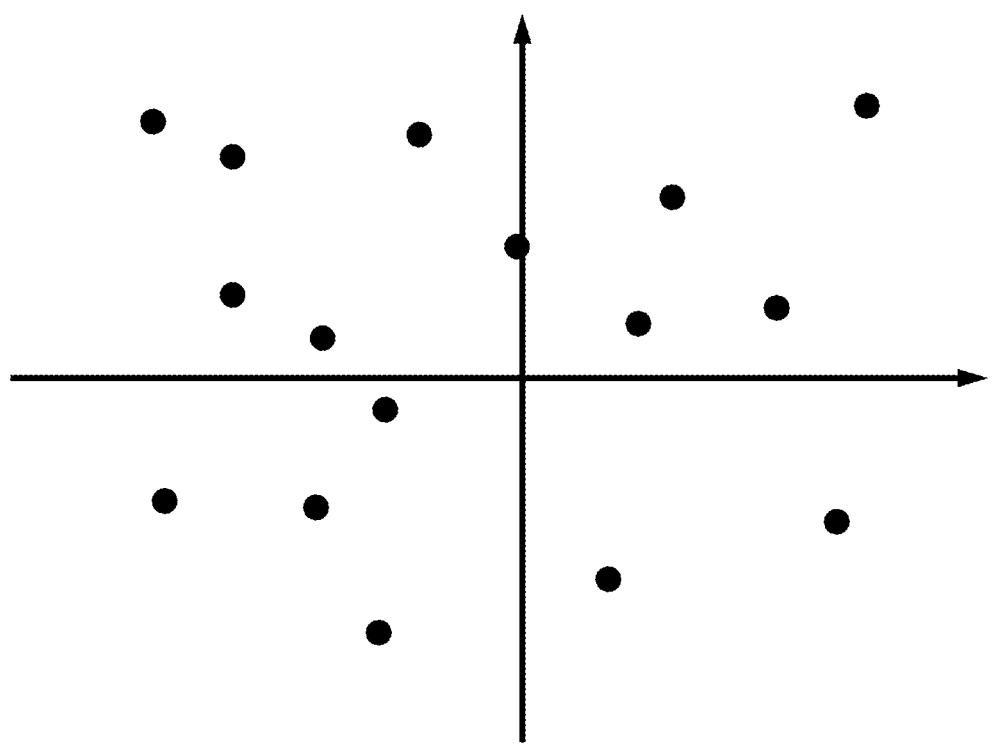
FIG. 4 shows an example of values of two processing parameters—dose (horizontal axis) and focus (vertical axis)

In step 312, a plurality of values of one or more processing parameters of the device manufacturing process are obtained. The plurality of values may be selected randomly or according to a rule. The plurality of values may also be obtained from other sources. The plurality of values may be a "set" of values. The term "set of values" means a collection of a single value for each of the processing parameters. FIG. 4 shows an example of a set of values where there are two processing parameters—dose (horizontal axis) and focus (vertical axis). In this example, a set of values of the processing parameters is a collection of two values—one value for the dose and one value for the focus. The values of the dose and focus may be relative values to a nominal best focus and a nominal best dose. In an embodiment, at least one of the plurality of sets of values is outside the IPW of at least one of the features selected in step 311.

In step 313, determine existence of defects, probability of the existence of defects, or both in imaging the selected features in step 311 under the values obtained step 312. The existence of defects, the probability of the existence of defects, or both may be determined from one or more characteristics (e.g. depth of focus (DOF) and dose latitude) of IPWs of the selected features in step 311 without actually determining the entire IPWs. The one or more characteristics of the IPWs may be compiled in to a map such as a map of DOF or a map of dose latitude. The existence of defects, the probability of the existence of defects, or both may also be determined may be by actually determining the IPWs.

The existence of defects, the probability of the existence of defects, or both may be determined using an empirical rule, a computational model, or by experiments. If an empirical rule is used, images (e.g., resist image, optical image, etch image) of the selected features are not simulated; instead, the empirical rule determines existence of defects, probability of the existence of defects, or both based on correlations between processing parameters, characteristics of the selected features, and defects. For example, an empirical rule may be a classifier or a database of features prone to defects.

A classifier may take the values obtained in step 312 and one or more characteristics of the selected features in step 311 as input (e.g., independent variables) and outputs the existence of defects, the probability of the existence of defects, or both.

The term "classifier" or "classification model" sometimes also refers to the mathematical function, implemented by a classification algorithm, that maps input data to a category. In machine learning and statistics, classification is the problem of identifying to which of a set of categories (subpopulations) a new observation belongs, on the basis of a training set of data containing observations (or instances) whose category membership is known. The individual observations are analyzed into a set of quantifiable properties, known as various explanatory variables, features, etc. These properties may variously be categorical (e.g. "good"—a lithographic process that does not produce defects or "bad"—a lithographic process that produces defects; "type 1", "type 2", . . . "type n"—different types of defects). Classification is considered an instance of supervised learning, i.e. learning where a training set of correctly identified observations is available. Examples of classification models are, logistic regression and multinomial logit, probit regression, the perceptron algorithm, support vector machines, import vector machines, and linear discriminant analysis.

If a computational model is used, a portion or a characteristic of the images of the selected features is calculated or simulated, and existence of defects is determined from the portion or the characteristic. For example, a line pull back defect may be determined by measuring a line end from its desired location; a bridging defect may be determined by finding a location where two lines undesirably join; an overlapping defect may be determined by finding two features on separate layers undesirably overlap or undesirably not overlap. An empirical rule may be less computationally expensive than a computational model. It is possible to compile existence of defects, probability of the existence of defects, or both into a map—i.e. to determine existence of defects, probability of the existence of defects, or both as a function of location.

If experiments are used, the existence of defects, the probability of the existence of defects, or both is be determined from data obtained from a wafer inspection tool, for example, using an after-development-inspection (ADI) tool, an after-etch-inspection tool, or a scanning electron microscope (SEM).

The defects may include necking, line pull back, line thinning, critical dimension error, overlapping, resist top loss, resist undercut, and bridging.

The processing parameters may include focus, dose, a characteristic an illumination source (e.g., intensity, pupil profile, etc.), a characteristic of a resist, a characteristic of projection optics, data obtained from metrology, and data from an operator of a processing apparatus used in the device manufacturing process, a characteristic of development and post-exposure baking of the resist, and a characteristic of etching.

Figure 5:
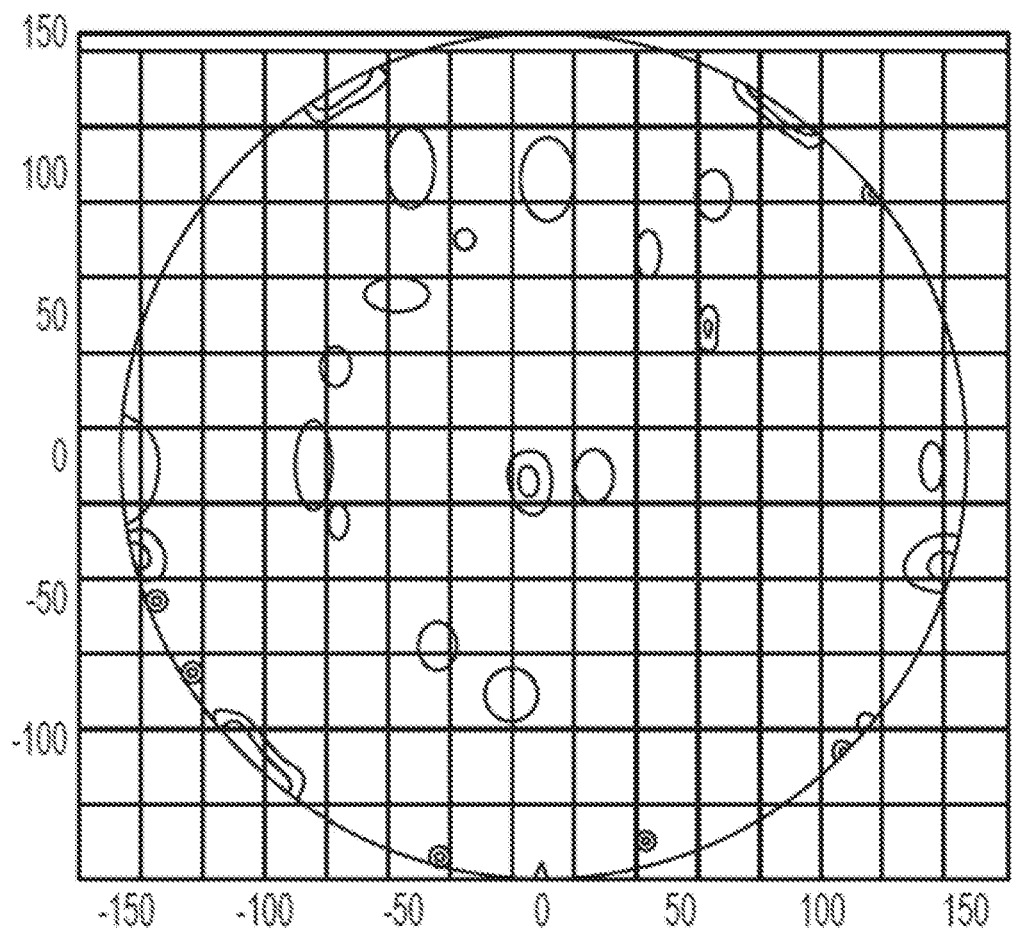
FIG. 5 shows a map for focus.

The processing parameters may be compiled into a map (e.g., lithographic parameters, or process conditions, as a function of location)—represented as functions of location. FIG. 5 shows a map for focus.

Figure 6:
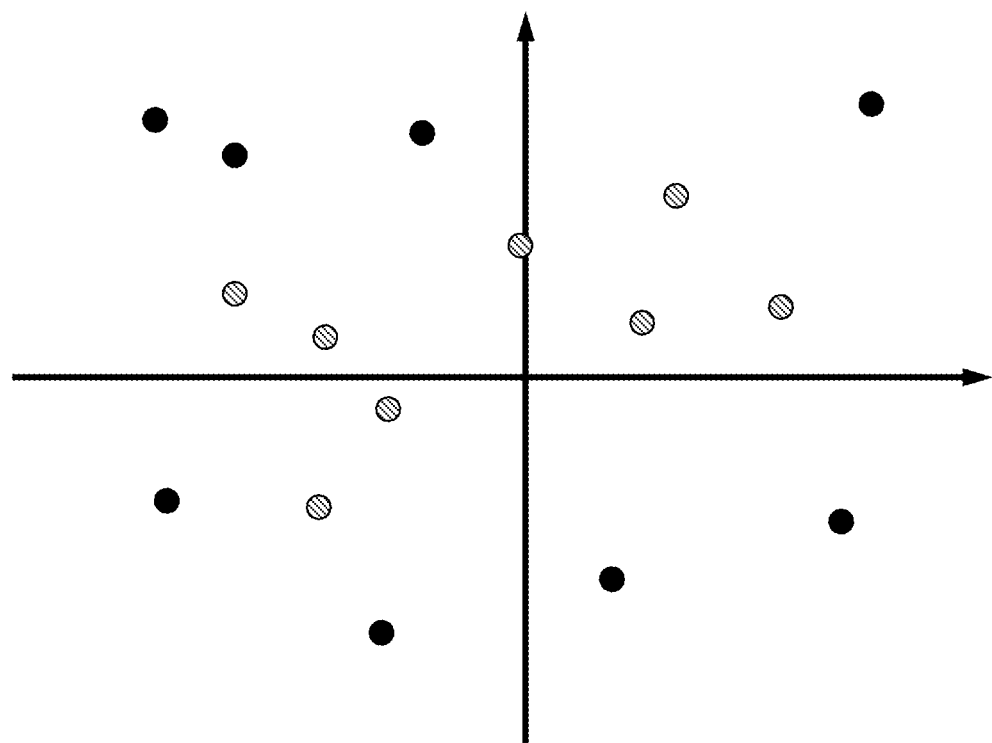
FIG. 6 shows that some points in FIG. 4 lead to defect or high probability of defect in a pattern.

FIG. 6 schematically shows that, for a particular pattern, some (represented by the diagonally hatched points) of the values of FIG. 4 do not lead to a defect or high probability of defect and some (represented by the solid points) lead to a defect or high probability of defect.

In step 314, the OPW of the area of interest is determined from the existence of defects, the probability of the existence of defects, or both. If the IPWs of the selected features are actually determined, the OPW may be determined by overlapping the IPWs.

In optional step 315, a point in the OPW is selected and the device manufacturing process is conducted under the values of the processing parameters represented by this point. The point may be one farthest from any boundary of the process window of the plurality of patterns.

The process window of all the patterns in one area of the patterning device may be different from that of all the patterns in another area. The method of FIG. 3 may be carried out separately for different areas.

In optional step 316, the global process window of a portion or the entire design layout may be determined from at least the OPW of the area of interest. For example, the global process window may be determined by overlapping the OPWs of multiple areas of interest.

In an embodiment, there is provided a method of determining an overlapping process window (OPW) of an area of interest on a portion of a design layout for a device manufacturing process for imaging the portion onto a substrate, the method comprising: obtaining a plurality of features in the area of interest; obtaining a plurality of values of one or more processing parameters of the device manufacturing process; determining, by a computer system, an existence of a defect, probability of the existence of a defect, or both, in imaging the plurality of features by the device manufacturing process under each of the plurality of values; and determining, by the computer system, the OPW of the area of interest from the existence of a defect, the probability of the existence of a defect, or both.

In an embodiment, the plurality of features is selected based on data representing the design layout. In an embodiment, the existence of a defect, the probability of the existence of a defect, or both, are determined from one or more characteristics of individual process windows (IPWs) of the plurality of features without actually determining the entire IPWs. In an embodiment, the method further comprises compiling the one or more characteristics into a map. In an embodiment, the existence of a defect, the probability of the existence of a defect, or both, is determined from individual process windows (IPWs) of the plurality of features. In an embodiment, the existence of a defect, the probability of the existence of a defect, or both, is determined using an empirical rule. In an embodiment, the empirical rule is a classifier or a database. In an embodiment, the classifier takes the plurality of values and one or more characteristics of the plurality of features as input and outputs the existence of a defect, the probability of the existence of a defect, or both. In an embodiment, the classifier is selected from a group consisting of: logistic regression and multinomial logit, probit regression, the perceptron algorithm, support vector machine, import vector machine, and linear discriminant analysis. In an embodiment, the existence of a defect, the probability of the existence of a defect, or both, is determined using a computational model that calculates or simulates a portion or a characteristic of images of the plurality of features, and determines the existence of a defect, the probability of the existence of a defect, or both, from the portion or the characteristic. In an embodiment, the existence of a defect, the probability of the existence of a defect, or both, is determined using experimental data obtained from a substrate inspection tool. In an embodiment, the defect is selected from a group consisting of necking, line pull back, line thinning, critical dimension error, overlapping, resist top loss, resist undercut, and bridging. In an embodiment, one or more of the one or more processing parameters are selected from a group consisting of: focus, dose, a characteristic of an illumination source, a characteristic of projection optics, a characteristic of a resist, data obtained from metrology, data from an operator of a processing apparatus used in the device manufacturing process, a characteristic of development of the resist, a characteristic of post-exposure baking of the resist, and a characteristic of etching. In an embodiment, the method further comprises determining individual process windows (IPWs) of the plurality of features. In an embodiment, determination of the OPW comprises overlapping the IPWs. In an embodiment, the method further comprises selecting a point in the OPW and conducting the device manufacturing process under values of the processing parameters represented by this point. In an embodiment, the point is farthest from any boundary of the OPW. In an embodiment, the plurality of features comprise a processing window limiting pattern (PWLP). In an embodiment, the device manufacturing process involves using a lithography apparatus. In an embodiment, the area of interest comprises a processing window limiting pattern (PWLP). In an embodiment, the area of interest comprises two or more disconnected portions of the design layout. In an embodiment, the area of interest is capable of being imaged concurrently onto the substrate by the device manufacturing process. In an embodiment, the method further comprises determining a global process window of the portion of the design layout from the OPW. In an embodiment, at least one of the plurality of values is outside an individual process window (IPW) of at least one of the plurality of features. In an embodiment, the plurality of values comprises a plurality of sets of values of a plurality of the processing parameters.

In an embodiment, there is provided a non-transitory computer program product comprising a computer readable medium having instructions recorded thereon, the instructions when executed by a computer implementing a method as described herein.

Embodiments may be implemented in hardware, firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments have been described above, it will be appreciated that the embodiments may be practiced otherwise than as described.

The invention claimed is:

1. A method of determining an overlapping process window (OPW) of an area of interest on a portion of a design layout for a device manufacturing process for imaging the portion onto a substrate, the method comprising:
    obtaining, by a hardware computer system, information regarding an existence of a defect, a probable existence of a defect, or both, in imaging each of a plurality of features in the area of interest by the device manufacturing process under each of a plurality of values of one or more processing parameters of the device manufacturing process; and
    determining, by the computer system and based on the information, the OPW of the area of interest including one or more of the plurality of features, the OPW, or data derived from the OPW, for configuring an aspect of the device manufacturing process.

2. The method of claim 1, wherein the plurality of features is selected based on data representing the design layout.

3. The method of claim 1, wherein the information is determined from one or more characteristics of individual process windows (IPWs) of the plurality of features without actually determining the entire IPWs.

4. The method of claim 1, further comprising selecting a point in the OPW and conducting the device manufacturing process under values of processing parameters represented by this point.

5. The method of claim 1, wherein the plurality of features or the area of interest comprises a processing window limiting pattern (PWLP).

6. The method of claim 1, further comprising determining a global process window of the portion of the design layout from the OPW.

7. A computer program product comprising a non-transitory computer-readable medium having instructions therein, the instructions, upon execution by a computer system, configured to cause the computer system to at least:

obtain information regarding an existence of a defect, a probable existence of a defect, or both, in imaging, by a device manufacturing process, each of a plurality of features in an area of interest on a portion of a design layout for imaging by the device manufacturing process onto a substrate under each of a plurality of values of one or more processing parameters of the device manufacturing process; and determine, based on the information, an overlapping process window (OPW) of the area of interest including one or more of the plurality of features, the OPW, or data derived from the OPW, for configuring an aspect of the device manufacturing process.

8. The computer program product of claim 7, wherein the instructions are further configured to cause the computer system to determine the information from individual process windows (IPWs) of the plurality of features.

9. The computer program product of claim 7, wherein the instructions are further configured to cause the computer system to determine the information using an empirical rule that is a classifier.

10. The computer program product of claim 9, wherein the classifier takes the plurality of values and one or more characteristics of the plurality of features as input and outputs the information.

11. The computer program product of claim 7, wherein the instructions are further configured to cause the computer system to determine the information using a computational model that calculates or simulates a part or a characteristic of images of the plurality of features, and determine the information from the part or the characteristic.

12. The computer program product of claim 7, wherein the instructions are further configured to cause the computer system to determine the information using experimental data obtained from a substrate inspection tool.

13. The computer program product of claim 7, wherein the instructions are further configured to cause the computer system to determine individual process windows (IPWs) of the plurality of features.

14. The computer program product of claim 13, wherein determination of the OPW comprises overlapping of the IPWs.

15. A non-transitory computer program product comprising a computer-readable medium having instructions therein, the instructions, upon execution by a computer system, configured to cause the computer system to at least:

obtain information regarding a plurality of overlapping process windows (OPWs) for a patterning device design layout to be processed using a device manufacturing process onto a substrate, each OPW corresponding to a different area of interest spatially distributed across the patterning device design layout; and produce electronic data representing or using the information regarding the plurality of OPWs for use in configuring an aspect of the device manufacturing process.

16. The computer program product of claim 15, wherein the instructions configured to obtain the information regarding a plurality of OPWs are further configured to cause the computer system to determine an OPW of each of the areas of interest of the patterning device layout based on a predicted production on the substrate of structures corresponding to features of each area of interest by the device manufacturing process under one or more values of one or more processing parameters of the device manufacturing process.

17. The computer program product of claim 15, wherein the instructions are further configured to cause the computer system to determine a global process window of at least a portion of the design layout from at least some of the OPWs.

18. The computer program product of claim 15, wherein the instructions are further configured to cause the computer system to determine individual process windows (IPWs) corresponding to at least one of the OPWs.

19. The computer program product of claim 15, wherein the instructions are further configured to cause the computer system to select a point in at least one of the OPWs, wherein the device manufacturing process is conducted under values of processing parameters represented by this point.

20. The computer program product of claim 15, wherein each area of interest comprises a processing window limiting pattern (PWLP).

* * * * *